United States Patent
Liu et al.

(10) Patent No.: US 10,778,405 B2
(45) Date of Patent: Sep. 15, 2020

(54) CLOCK GENERATING CIRCUIT AND HYBRID CIRCUIT

(71) Applicant: REALTEK SEMICONDUCTOR CORPORATION, Hsinchu (TW)

(72) Inventors: Jian Liu, Suzhou (CN); Weixiong He, Suzhou (CN); Jianing Lou, Hangzhou (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/507,504

(22) Filed: Jul. 10, 2019

(65) Prior Publication Data

US 2020/0021425 A1    Jan. 16, 2020

(30) Foreign Application Priority Data

Jul. 13, 2018  (CN) .......................... 2018 1 0769563

(51) Int. Cl.
| | |
|---|---|
| *H04L 7/033* | (2006.01) |
| *H03L 7/08* | (2006.01) |
| *H04L 7/00* | (2006.01) |
| *H03L 7/099* | (2006.01) |
| *H03L 7/089* | (2006.01) |

(52) U.S. Cl.
CPC .......... *H04L 7/0331* (2013.01); *H03L 7/0807* (2013.01); *H03L 7/0891* (2013.01); *H03L 7/0995* (2013.01); *H04L 7/0037* (2013.01); *H04L 7/0087* (2013.01)

(58) Field of Classification Search
None
See application file for complete search history.

(56) References Cited

U.S. PATENT DOCUMENTS

| | | | | |
|---|---|---|---|---|
| 5,920,600 A | * | 7/1999 | Yamaoka | H03L 7/0805 |
| | | | | 327/149 |
| 5,953,690 A | * | 9/1999 | Lemon | H03G 3/3089 |
| | | | | 250/214 C |
| 6,040,743 A | * | 3/2000 | Bjorklid | H03L 7/099 |
| | | | | 331/57 |

(Continued)

FOREIGN PATENT DOCUMENTS

| | | | | | |
|---|---|---|---|---|---|
| CN | 101820318 A | * | 9/2010 | ........... | H04L 7/0337 |
| CN | 101820318 B | * | 9/2012 | ........... | H04L 7/0337 |

(Continued)

*Primary Examiner* — Berhanu Tadese
(74) *Attorney, Agent, or Firm* — WPAT, PC

(57) ABSTRACT

Disclosed is a clock generating circuit capable of operating in an analog clock data recovery (ACDR) mode to reduce the loop latency or a clock multiplication unit (CMU) mode to suppress reference jitter. The circuit includes a filter and an oscillator. The filter receives an input signal to determine voltages of a first node and a second node respectively and includes a first filtering circuit and a second filtering circuit coupled in parallel between the first node and a reference voltage terminal. The second filtering circuit includes a switch and a capacitor connected in series, wherein the second node is between the switch and capacitor, and the switch is turned off in the ACDR mode and turned on in the CMU mode. The oscillator outputs a clock according to the first node's voltage in the ACDR mode or according to the second node's voltage in the CMU mode.

11 Claims, 9 Drawing Sheets

(56) References Cited

U.S. PATENT DOCUMENTS

| | | | | |
|---|---|---|---|---|
| 6,901,126 B1* | 5/2005 | Gu | | H03L 7/0998 375/354 |
| 7,089,444 B1* | 8/2006 | Asaduzzaman | | H04L 7/033 375/376 |
| 7,679,459 B2* | 3/2010 | Menolfi | | H03L 7/085 331/45 |
| 7,729,459 B1* | 6/2010 | Kang | | H04L 7/0338 327/141 |
| RE41,517 E* | 8/2010 | Possley | | H04L 25/4904 341/56 |
| 7,893,724 B2* | 2/2011 | Moyal | | H03K 5/156 327/12 |
| 7,970,090 B1* | 6/2011 | Tetzlaff | | H04L 7/033 327/147 |
| 8,092,083 B2* | 1/2012 | Venkataraman | | G01K 7/01 257/470 |
| 8,120,408 B1* | 2/2012 | Sivadasan | | H03H 11/265 327/261 |
| 8,537,953 B2* | 9/2013 | Lin | | H03L 7/087 375/373 |
| 8,892,617 B2* | 11/2014 | Tzeng | | G01R 31/31709 708/271 |
| 9,088,291 B2* | 7/2015 | Liao | | H03L 7/1976 |
| 9,973,178 B1* | 5/2018 | Holzmann | | H03K 5/134 |
| 10,027,332 B1* | 7/2018 | Wang | | H03L 7/0891 |
| 10,200,188 B2* | 2/2019 | Tajalli | | H03L 7/093 |
| 2004/0213585 A1* | 10/2004 | Buchali | | H04L 7/027 398/202 |
| 2005/0093591 A1* | 5/2005 | Rhee | | H03L 7/0814 327/156 |
| 2006/0197566 A1* | 9/2006 | Jakobs | | H03K 5/131 327/158 |
| 2008/0088379 A1* | 4/2008 | Chen | | H03K 5/133 331/57 |
| 2009/0002082 A1* | 1/2009 | Menolfi | | H04L 7/033 331/57 |
| 2009/0015300 A1* | 1/2009 | Farnsworth | | H03K 5/06 327/119 |
| 2009/0074125 A1* | 3/2009 | Lin | | H04L 7/033 375/375 |
| 2012/0105115 A1* | 5/2012 | Yamamoto | | H03L 7/091 327/156 |
| 2014/0064423 A1* | 3/2014 | Chen | | H04L 7/0004 375/374 |
| 2015/0098527 A1* | 4/2015 | Wang | | H03L 7/07 375/316 |
| 2015/0180642 A1* | 6/2015 | Hsieh | | H04L 25/03057 375/233 |
| 2015/0188694 A1* | 7/2015 | Kuan | | H04L 7/0087 375/355 |
| 2016/0308539 A1* | 10/2016 | Chen | | H03L 7/099 |
| 2017/0187516 A1* | 6/2017 | Liu | | H03L 7/0807 |
| 2018/0083809 A1* | 3/2018 | Tajalli | | H04L 25/14 |
| 2018/0115410 A1* | 4/2018 | Tajalli | | H03L 7/0998 |
| 2018/0343011 A1* | 11/2018 | Tajalli | | H03L 7/081 |
| 2019/0013929 A1* | 1/2019 | Hailu | | H03L 7/16 |
| 2019/0245678 A1* | 8/2019 | Bai | | H04B 10/25 |
| 2020/0021425 A1* | 1/2020 | Liu | | H03L 7/093 |

FOREIGN PATENT DOCUMENTS

| | | | | |
|---|---|---|---|---|
| CN | 102982002 A | * | 3/2013 | ........... H04L 7/0337 |
| CN | 102982002 B | * | 11/2015 | ........... H04L 7/0337 |
| CN | 208227041 U | * | 12/2018 | ........... H04L 7/0337 |
| JP | 2003333021 A | * | 11/2003 | ............. H03L 7/091 |
| KR | 20020050730 A | * | 6/2002 | ........... H04L 7/0337 |

\* cited by examiner

CLOCK GENERATING CIRCUIT AND HYBRID CIRCUIT

BACKGROUND OF THE INVENTION

1. Field of the Invention

The present invention relates to a clock generating circuit and a hybrid circuit, especially to a clock generating circuit and a hybrid circuit capable of operating for an analog clock data recovery (ACDR) mode and a clock multiplication unit (CMU) mode adaptively.

2. Description of Related Art

A conventional Serializer/Deserializer (SerDes) physical layer circuit (PHY) includes a receiving circuit and a transmitting circuit. The receiving circuit includes an analog clock data recovery (ACDR) circuit and the transmitting circuit includes a clock multiplication unit (CMU). Each of the ACDR circuit and the CMU includes a charge pump, a low pass filter, and a voltage-controlled oscillator; accordingly, if the ACDR circuit and the CMU can share the same charge pump, low pass filter and voltage-controlled oscillator, the total circuit area of the ACDR circuit and the CMU can be reduced.

However, the requirements for a low pass filter of the ACDR circuit and a low pass filter of the CMU are different so that it is very difficult to design a low pass filter meeting the requirements of the both sides. FIG. 1 shows a second-order low pass filter 100 which can be applied to an ACDR circuit and a CMU. The low pass filter 100 includes a resistor 110, a capacitor 120, a switch 130, and a capacitor 140. When the low pass filter 100 is applied to an ACDR circuit, in order to reduce the loop latency of the whole ACDR circuit, the capacitance of the capacitor 140 should be as small as possible and therefore the switch 130 should be turned off; on the other hand, when the low pass filter 100 is applied to a CMU, in order to deeply suppress reference jitter with proper loop stability and bandwidth of the CMU, the capacitance of the capacitor 140 should be as large as possible under the circumstance of enough loop stability and therefore the switch 130 should be turned on. However, when the switch 130 is turned on, the switch resistor of the switch 130 is not negligible; consequently, after the switch resistor is connected with the capacitor 140 in series, not only the switch resistor reduces the quality factor of the capacitor 140 but also the voltage of the gate terminal of the switch 130 (e.g., transistor) interferes with the voltage outputted to the CMU's voltage-controlled oscillator via the parasitic capacitor of the switch 130. Accordingly, when the low pass filter 100 is applied to a CMU, the above-mentioned problems will lead to a greater jitter of the CMU's output clock.

In light of the above, the design of a low pass filter suitable for an ACDR circuit and a CMU falls into a dilemma.

SUMMARY OF THE INVENTION

An object of the present invention is to provide a clock generating circuit and a hybrid circuit for making an improvement over the prior art.

The present invention discloses a clock generating circuit capable of operating for an analog clock data recovery (ACDR) mode and a clock multiplication unit (CMU) mode adaptively. According to an embodiment of the present invention, the clock generating circuit includes a filter and a ring oscillator. The filter is configured to receive an input signal and thereby determine a first voltage signal and a second voltage signal according to the input signal, in which the first voltage signal and the second voltage signal are outputted to the ring oscillator via a first node and a second node respectively. The filter includes: a first filtering circuit coupled between the first node and a reference voltage terminal; and a second filtering circuit, coupled between the first node and the reference voltage terminal and connected with the first filtering circuit in parallel, including a switch and a capacitor connected in series, in which the switch is turned off in the ACDR mode and turned on in the CMU mode and the second node is between the switch and the capacitor. The ring oscillator, coupled with the first node and the second node, is configured to output at least one clock according to the first voltage signal without being affected by the second voltage signal in the ACDR mode and output at least one clock according to the second voltage signal without being affected by the first voltage signal in the CMU mode.

The present invention also discloses a hybrid circuit capable of operating in one of an analog clock data recovery (ACDR) mode and a clock multiplication unit (CMU) mode. According to an embodiment of the present invention, the hybrid circuit includes a CMU circuit, a sampling circuit, a phase detector, and a multiplexer. The CMU circuit includes a phase frequency detector, a charge pump, a filter, a ring oscillator, and a loop divider, in which the charge pump is configured to generate a voltage control signal according to an output of one of the phase detector and the phase frequency detector, the filter is configured to determine at least one of a first voltage signal and a second voltage signal, that is outputted to the ring oscillator, according to the voltage control signal of the charge pump, and the ring oscillator is configured to output at least one clock according to the first voltage signal in the ACDR mode and output at least one clock according to the second voltage signal in the CMU mode. The sampling circuit is configured to operate according to an output of the ring oscillator. The phase detector is configured to operate according to an output of the sampling circuit. The multiplexer is configured to electrically connect the phase detector and the charge pump and electrically disconnect the phase frequency detector from the charge pump in the ACDR mode so as to allow the charge pump to generate the voltage control signal according to the output of the phase detector, and the multiplexer is also configured to electrically connect the phase frequency detector and the charge pump and electrically disconnect the phase detector from the charge pump in the CMU mode so as to allow the charge pump to generate the voltage control signal according to the output of the phase frequency detector.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present invention includes a clock generating circuit and a hybrid circuit capable of operating for an analog clock data recovery (ACDR) mode and a clock multiplication unit (CMU) mode adaptively so that the present invention can reduce the loop latency of an ACDR circuit in the ACDR mode and deeply suppress reference jitter with proper loop stability and bandwidth of an CMU circuit in the CMU mode.

Figure 1:
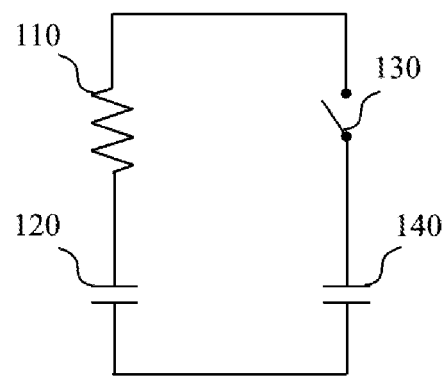
FIG. 1 shows a filter of the prior art.
Figure 2:
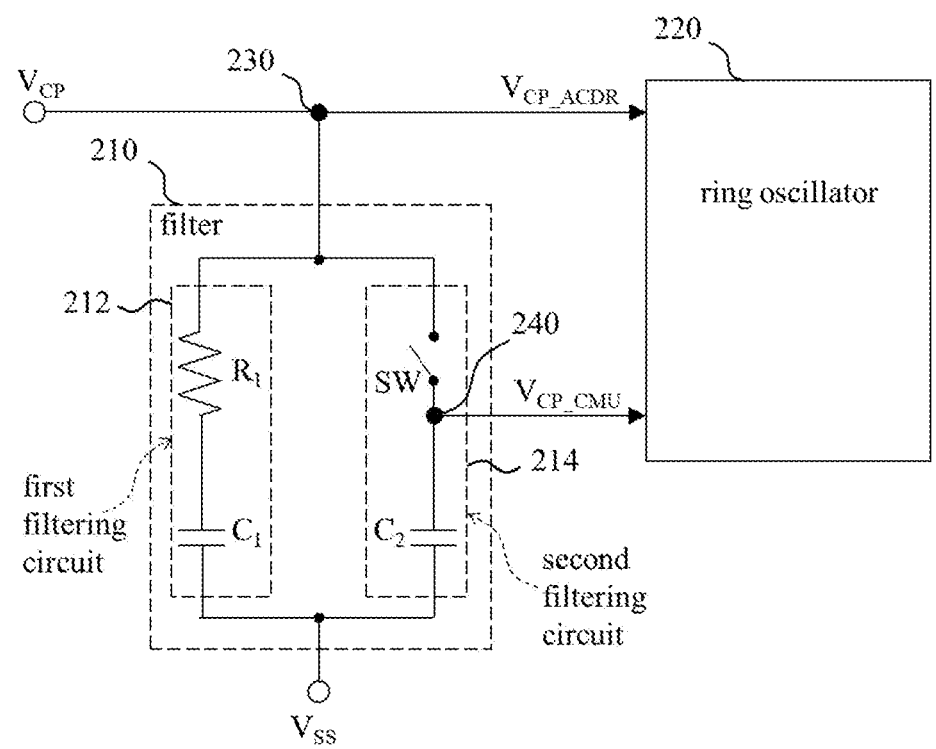
FIG. 2 shows an embodiment of the clock generating circuit of the present invention.

FIG. 2 shows an embodiment of the clock generating circuit of the present invention. The clock generating circuit 200 of FIG. 2 includes a filter 210 and a ring oscillator 220. The filter 210 is configured to receive an input signal $V_{CP}$ and thereby determine a first voltage signal $V_{CP\_ACDR}$ and a second voltage signal $V_{CP\_CMU}$ according to the input signal $V_{CP}$, in which the first voltage signal $V_{CP\_ACDR}$ and the second voltage signal $V_{CP\_CMU}$ are outputted to the ring oscillator 220 via a first node 230 and a second node 240 respectively. The filter 210 includes a first filtering circuit 212 and a second filtering circuit 214. The first filtering circuit 212 is coupled between a first node 230 and a reference voltage terminal $V_{SS}$ (e.g., a low voltage terminal $V_{SS}$ such as a ground terminal), and includes a resistor $R_1$ and a capacitor $C_1$. The second filtering circuit 214 is coupled between the first node 230 and the low voltage terminal $V_{SS}$ and connected with the first filtering circuit 212 in parallel, and includes a switch SW and a capacitor $C_2$ connected in series while the second node 240 is between the switch SW and the capacitor $C_2$. When the clock generating circuit 200 is used for an ACDR circuit, the switch SW is turned off (i.e., substantially nonconducting) in the ACDR mode so as to prevent the capacitor $C_2$ from affecting the ACDR circuit disadvantageously; on the other hand, when the clock generating circuit 200 is used for a CMU circuit, the switch SW is turned on (i.e., substantially conductive) in the CMU mode so that the capacitor $C_2$ assists in suppressing reference jitter with proper loop stability and bandwidth of the CMU circuit. The ring oscillator 220 is coupled with the first node 230 and the second node 240, and configured to output at least one clock (e.g., the output of any of the oscillating circuits in FIG. 3) according to the first voltage signal $V_{CP\_ACDR}$ in the ACDR mode and output at least one clock (e.g., the output of any of the oscillating circuits in FIG. 3) according to the second voltage signal $V_{CP\_CMU}$ in the CMU mode.

Figure 3:
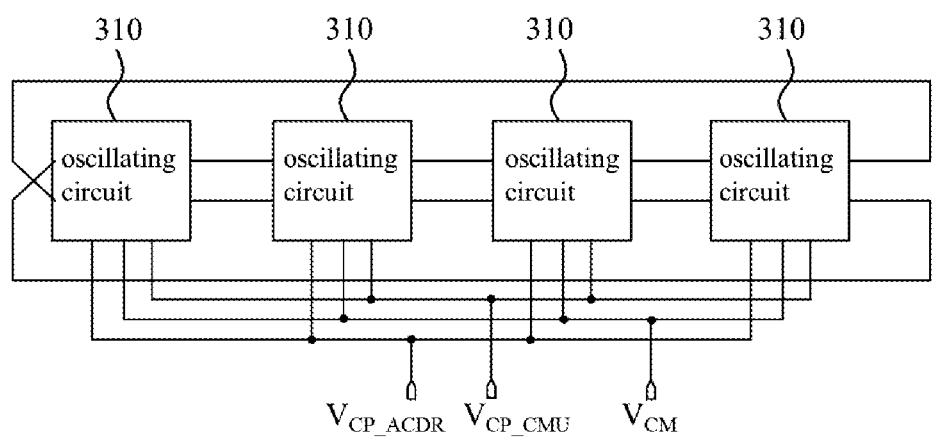
FIG. 3 shows an embodiment of the ring oscillator of FIG. 2.

FIG. 3 shows an embodiment of the ring oscillator 220. The ring oscillator 220 of FIG. 3 includes a plurality of oscillating circuits 310. The oscillation input for an $N^{th}$ oscillating circuit 310 is the oscillation output of an $(N-1)^{th}$ oscillating circuit 310, in which the $N^{th}$ oscillating circuit 310 and the $(N-1)^{th}$ oscillating circuit 310 are adjacent; similarly, the oscillation output of the $N^{th}$ oscillating circuit 310 is the oscillation input for an $(N+1)^{th}$ oscillating circuit 310, wherein each of "$N^{th}$", "$(N-1)^{th}$", and "$(N+1)^{th}$" is an ordinal number with respect to the order of the plurality of oscillating circuits 310. It should be noted that the number of the oscillating circuits 310 in FIG. 3 is just exemplary, and the number can be determined in accordance with a demand for implementation. In the ACDR mode, each oscillating circuit 310 operates according to the first voltage signal $V_{CP\_ACDR}$ and a control voltage $V_{CM}$ without being affected by the second voltage signal $V_{CP\_CMU}$; in the CMU mode, each oscillating circuit 310 operates according to the second voltage signal $V_{CP\_CMU}$ and the control voltage $V_{CM}$ without being affected by the first voltage signal $V_{CP\_ACDR}$. The control voltage $V_{CM}$ here is a predetermined voltage (e.g., a fixed voltage $V_{DD}/2$, or a voltage allowing the ring oscillating circuit 220 to operate appropriately).

Figure 4:
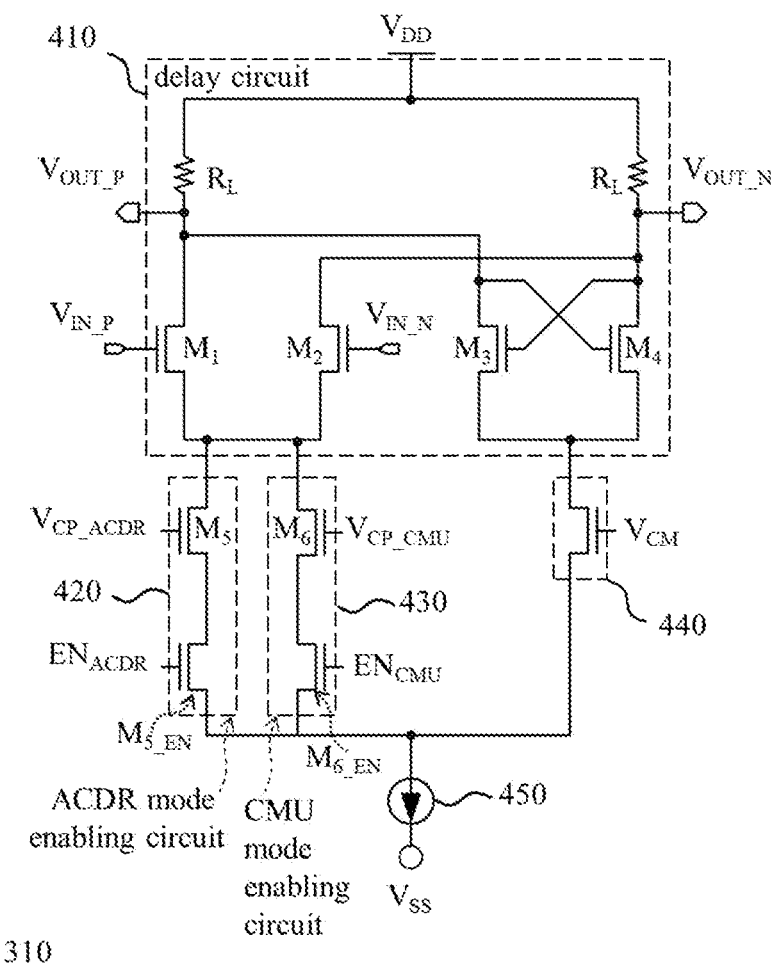
FIG. 4 shows an embodiment of the oscillating circuit of FIG. 3.

FIG. 4 shows an embodiment of each of the oscillating circuits 310 of FIG. 3. The oscillating circuit 310 of FIG. 4 includes a delay circuit 410, an ACDR mode enabling circuit 420, a CMU mode enabling circuit 430, a transistor 440, and a current source 450. The delay circuit 410 is coupled to another reference voltage terminal $V_{DD}$ (e.g., a high voltage terminal $V_{DD}$), and includes loads $R_L$ and transistors $M_1$, $M_2$, $M_3$, and $M_4$. The delay circuit 410 is configured to generate the oscillation output (i.e., the input for an oscillating circuit 310 following the oscillating circuit 310 of FIG. 4) according to the oscillation input (i.e., the output of an oscillating circuit 310 followed by the oscillating circuit 310 of FIG. 4). The oscillation input in FIG. 4 is a differential input $V_{IN\_P}$, $V_{IN\_N}$ while the oscillation output in FIG. 4 is a differential output $V_{OUT\_P}$, $V_{OUT\_N}$; however, the delay circuit 410 can be a known or self-developed delay circuit for receiving a single-ended input and outputting a single-ended output. The ACDR mode enabling circuit 420 is coupled between the delay circuit 410 and the current source 450 and includes a transistor $M_5$ and a transistor $M_{5\_EN}$ that are connected in series. The gate terminal of the transistor $M_5$ is used for receiving the first voltage signal $V_{CP\_ACDR}$ and the gate terminal of the transistor $M_{5\_EN}$ is used for receiving a first control signal $EN_{ACDR}$ generated by a control circuit (e.g., the control circuit 620 of FIG. 6). The CMU mode enabling circuit 430 is coupled between the delay circuit 410 and the current source 450 and includes a transistor $M_6$ and a transistor $M_{6\_EN}$ that are connected in series. The gate terminal of the transistor $M_6$ is used for receiving the second voltage signal $V_{CP\_CMU}$ and the gate terminal of the transistor $M_{6\_EN}$ is used for receiving a second control signal $EN_{CMU}$ generated by a control circuit (e.g., the control circuit 620 of FIG. 6). The transistor 440 is coupled between the delay circuit 410 and the current source 450 and configured to operate according to the aforementioned control voltage $V_{CM}$.

Figure 5:
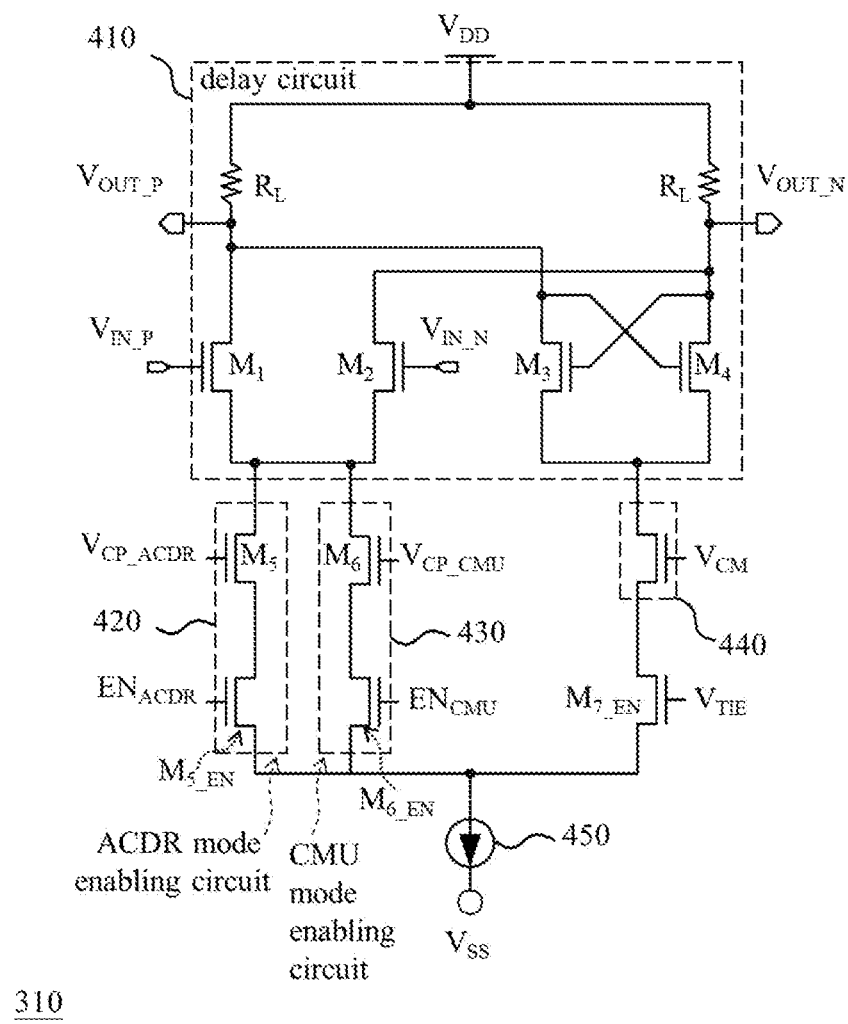
FIG. 5 shows another embodiment of the oscillating circuit of FIG. 3.

FIG. 5 shows another embodiment of each of the oscillating circuits 310 of FIG. 3. In comparison with FIG. 4, the oscillating circuit 310 of FIG. 5 further includes a transistor $M_{7\_EN}$ configured to improve the symmetry of the circuit configuration. The transistor $M_{7\_EN}$ is coupled between the transistor 440 and the current source 450, and the gate terminal of the transistor $M_{7\_EN}$ is configured to receive a predetermined voltage $V_{TIE}$ (e.g., a fixed or non-fixed voltage) to keep the transistor $M_{7\_EN}$ conducting during the operation of the oscillating circuit 310 of FIG. 5.

Figure 6:
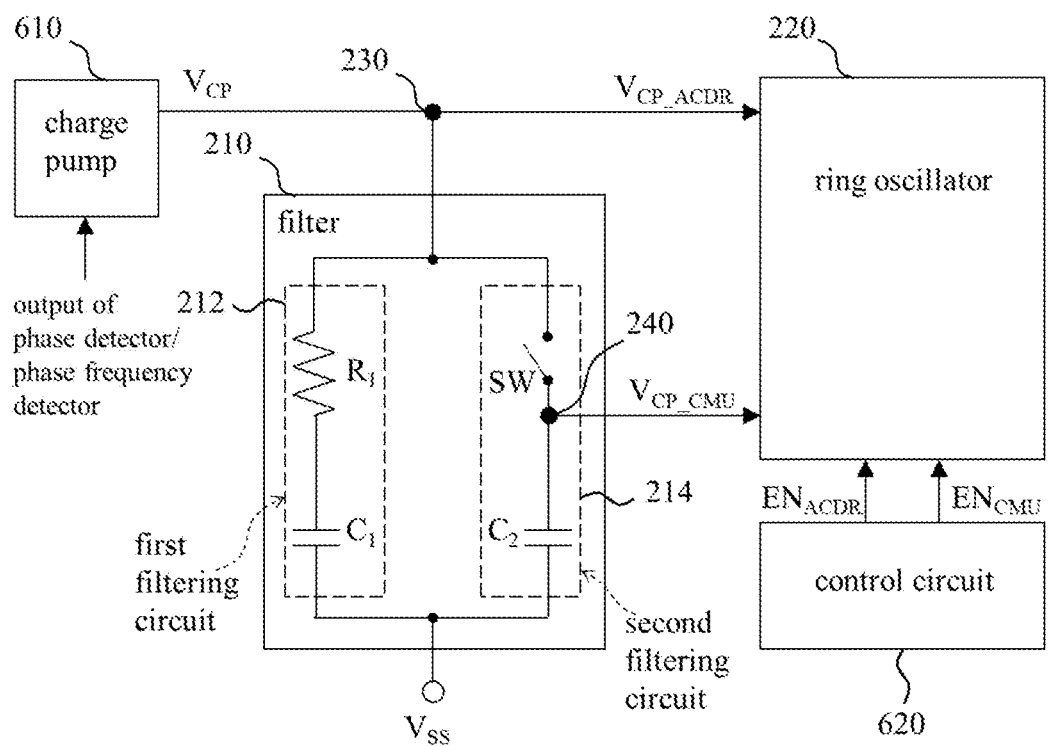
FIG. 6 shows another embodiment of the clock generating circuit of the present invention.

FIG. 6 shows another embodiment of the clock generating circuit of the present invention. In comparison with FIG. 2, the clock generating circuit 600 of FIG. 6 further includes a charge pump 610 and a control circuit 620. The charge pump 610 is configured to generate the input signal $V_{CP}$ according to the output of a phase detector (PD) in the ACDR mode, and also configured to generate the input signal $V_{CP}$ according to the output of a phase frequency detector (PFD) in the CMU mode. The control circuit 620 is configured to output the first control signal $EN_{ACDR}$ and the second control signal $EN_{CMU}$. When the first control signal $EN_{ACDR}$ corresponds a first level (e.g., a high voltage level) and the second control signal $EN_{CMU}$ corresponds to a second level (e.g., a low voltage level), the clock generating circuit 600 operates in the ACDR mode; when the first control signal $EN_{ACDR}$ corresponds the second level and the second control signal $EN_{CMU}$ corresponds to the first level, the clock generating circuit 600 operates in the CMU mode. Since each of the charge pump 510 and the control circuit 620 is a known or self-developed circuit, their detail is omitted here.

Figure 7:
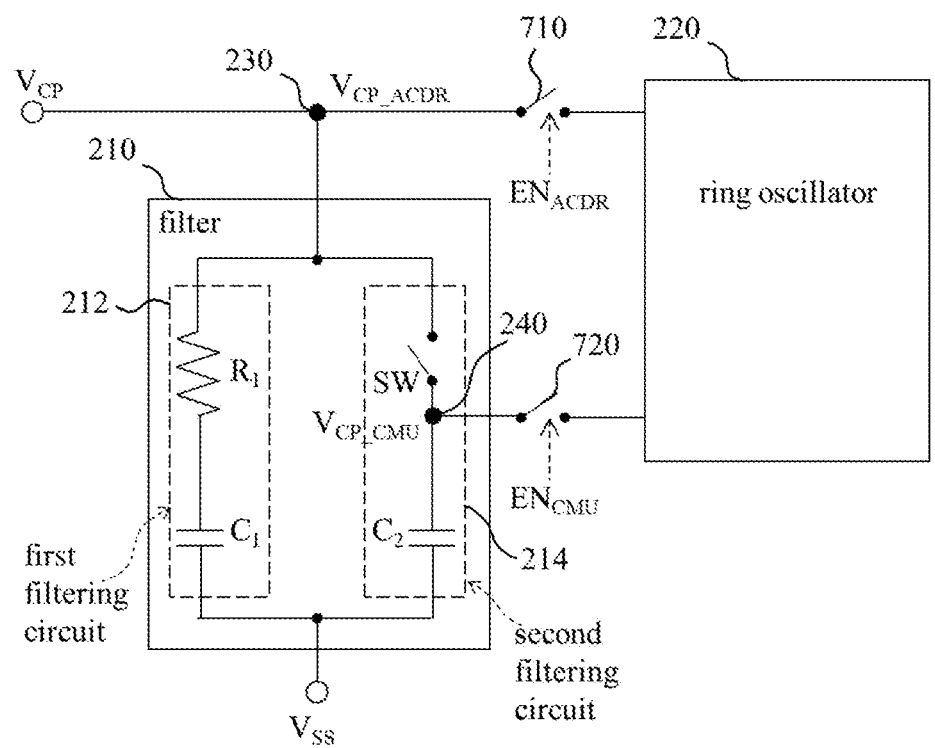
FIG. 7. shows yet another embodiment of the clock generating circuit of the present invention.

FIG. 7 shows yet another embodiment of the clock generating circuit of the present invention. In comparison with FIG. 2, the clock generating circuit 700 of FIG. 7 includes a switch 710 between the first node 230 and the ring oscillator 220 and a switch 720 between the second node 240 and the ring oscillator 220. The function of the switch 710 is equivalent/similar to the aforementioned transistor $M_{5\_EN}$ and configured to be turned on or off according to the aforementioned first control signal $EN_{ACDR}$. The function of the switch 720 is equivalent/similar to the aforementioned transistor $M_{6\_EN}$ and configured to be turned on or off according to the aforementioned second control signal $EN_{CMU}$. In an exemplary implementation, when the first control signal $EN_{ACDR}$ corresponds to a first level (e.g., a high voltage level) and the second control signal $EN_{CMU}$ corresponds to a second level (e.g., a low voltage level), the switch 710 is turned on and the switch 720 is turned off so that the filter 210 outputs the first voltage signal $V_{CP\_ACDR}$ instead of the second voltage signal $V_{CP\_CMU}$ to the ring oscillator 220; meanwhile, the clock generating circuit 700 functions as a part of an ACDR circuit. In an exemplary implementation, when the first control signal $EN_{ACDR}$ corresponds to the second level and the second control signal $EN_{CMU}$ corresponds to the first level, the switch 710 is turned off and the switch 720 is turned on so that the filter 210 outputs the second voltage signal $V_{CP\_CMU}$ instead of the first voltage signal $V_{CP\_ACDR}$ to the ring oscillator 220; meanwhile, the clock generating circuit 700 functions as a part of a CMU circuit.

Figure 8:
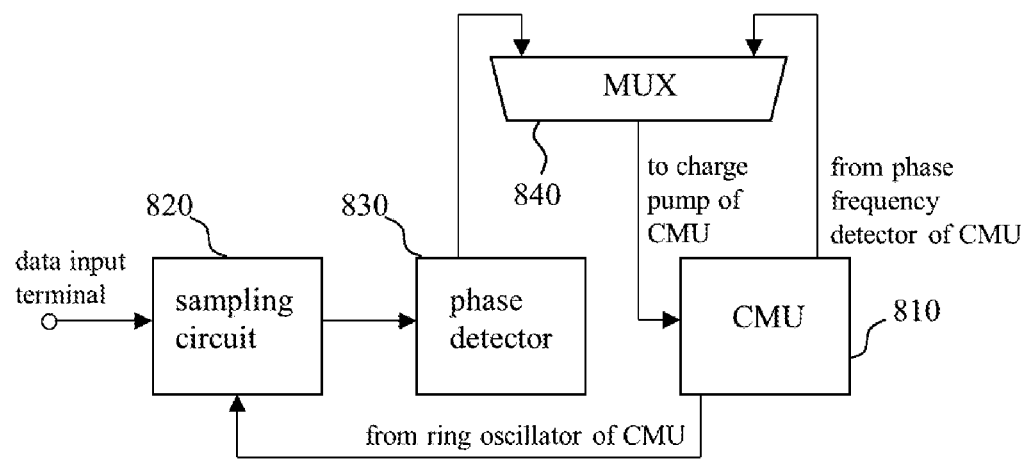
FIG. 8 shows an embodiment of the hybrid circuit of the present invention.
Figure 9:
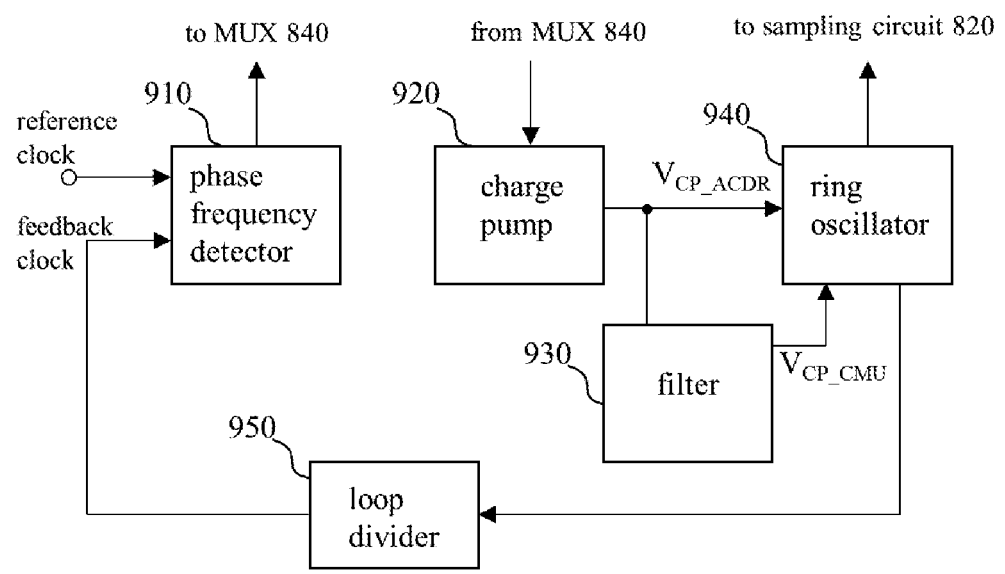
FIG. 9 shows an embodiment of the clock multiplication unit of FIG. 8.

FIG. 8 shows an embodiment of the hybrid circuit of the present invention. As shown in FIG. 8, the hybrid circuit 800 includes a CMU 810, a sampling circuit 820, a phase detector 830, and a multiplexer (MUX) 840. FIG. 9 shows an embodiment of the CMU 810 including a phase frequency detector 910, a charge pump 920, a filter 930, a ring oscillator 940, and a loop divider 950. The phase frequency detector 910 outputs a phase frequency detection signal to the MUX 840 according to a reference clock and a feedback clock; the charge pump 920 generates a voltage-controlled signal according the output of the MUX 840; the filter 930 is identical/equivalent to the filter 210 of FIG. 2 and configured to determine at least one of a first voltage signal $V_{CP\_ACDR}$ and a second voltage signal $V_{CP\_CMU}$ for the ring oscillator 940 according to the voltage-controlled signal of the charge pump 920; the ring oscillator 940 is identical/equivalent to the ring oscillator 220 of FIG. 2 and includes a plurality of oscillating circuits connected in series, in which each oscillating circuit is configured to operate according to the first voltage signal $V_{CP\_ACDR}$ without being affected by the second voltage signal $V_{CP\_CMU}$ in the ACDR mode and configured to operate according to the second voltage signal $V_{CP\_CMU}$ without being affected by the first voltage signal $V_{CP\_ACDR}$ in the CMU mode; and the loop divider 950 is configured to generate the feedback clock according to the output clock of the ring oscillator 940. Please refer to FIG. 8, the sampling circuit 820 is configured to sample a signal of a data input terminal according to the output clock of the ring oscillator 940. The phase detector 830 is configured to output a phase detection signal to the MUX 840 according to the output of the sampling circuit 820 (i.e., the result of sampling the signal). The MUX 840 is configured to electrically connect the phase detector 830 with the charge pump 920 and electrically disconnect the phase frequency detector 910 from the charge pump 920 in the ACDR mode so as to output the phase detection signal of the phase detector 830 to the charge pump 920, and the MUX 840 is also configured to electrically connect the phase frequency detector 910 with the charge pump 920 and electrically disconnect the phase detector 830 from the charge pump 920 in the CMU mode so as to output the phase frequency detection signal of the phase frequency detector 910 to the charge pump 920. It should be noted that each of the sampling circuit 820, the phase detector 830, the MUX 840, the phase frequency detector 910, the charge pump 920, and the loop divider 950 is a known or self-developed circuit, and their detail is omitted here.

Since those of ordinary skill in the art can appreciate the detail and the modification of the embodiments of FIGS. 8-9 by referring to the disclosure of the embodiments of FIGS. 2-7, repeated and redundant description is omitted here.

It should be noted that people of ordinary skill in the art can implement the present invention by selectively using some or all of the features of any embodiment in this specification or selectively using some or all of the features of multiple embodiments in the specification as long as such implementation is practicable, which implies that the present invention can be carried out flexibly.

To sum up, the present invention can operate for the ACDR mode and the CMU mode adaptively so as to reduce the loop latency of an ACDR circuit in the ACDR mode and deeply suppress reference jitter with proper loop stability and bandwidth of a CMU circuit in the CMU mode.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:
1. A clock generating circuit capable of operating in one of an analog clock data recovery (ACDR) mode and a clock multiplication unit (CMU) mode, comprising:
   a filter configured to receive an input signal and thereby determine a first voltage signal and a second voltage signal according to the input signal, the first voltage signal and the second voltage signal being outputted to a ring oscillator via a first node and a second node respectively, the filter including:
      a first filtering circuit coupled between the first node and a reference voltage terminal; and
      a second filtering circuit that is coupled between the first node and the reference voltage terminal and is coupled with the first filtering circuit in parallel and includes a switch and a capacitor coupled in series, wherein the second node is between the switch and the capacitor, and the switch is turned off in the ACDR mode and turned on in the CMU mode; and the ring oscillator that is coupled with the first node and the second node and that is configured to output at least one first clock according to the first voltage signal in the ACDR mode and to output at least one second clock according to the second voltage signal in the CMU mode.

2. The clock generating circuit of claim 1, further comprising: a charge pump configured to generate the input signal according to an output of a phase detector in the ACDR mode and generate the input signal according to an output of a phase frequency detector in the CMU mode.

3. The clock generating circuit of claim 1, further comprising a control circuit configured to output a first control signal and a second control signal to the ring oscillator, wherein the circuit operates in the ACDR mode when the first control signal corresponds to a first level and the second control signal corresponds to a second level, and the circuit operates in the CMU mode when the first control signal corresponds to the second level and the second control signal corresponds to the first level.

4. The clock generating circuit of claim 3, wherein the ring oscillator includes a plurality of oscillating circuits coupled in series, and each of the oscillating circuits includes:
  a delay circuit configured to generate an oscillation output according to an oscillation input;
  an ACDR mode enabling circuit that is coupled between the delay circuit and a current source and includes a first transistor and a second transistor coupled in series, wherein a gate terminal of the first transistor is configured to receive the first voltage signal and a gate terminal of the second transistor is configured to receive the first control signal;
  a CMU mode enabling circuit that is coupled between the delay circuit and the current source and includes a third transistor and a fourth transistor coupled in series, wherein a gate terminal of the third transistor is configured to receive the second voltage signal and a gate terminal of the fourth transistor is configured to receive the second control signal; and
  a fifth transistor that is coupled between the delay circuit and the current source and that is configured to operate according to a control voltage.

5. The clock generating circuit of claim 4, wherein each of the oscillating circuits further includes: a sixth transistor that is coupled between the fifth transistor and the current source and includes a gate terminal for receiving a fixed voltage to keep the sixth transistor conductive.

6. The clock generating circuit of claim 1, further comprising: a control circuit configured to output a first control signal to a first switch between the first node and the ring oscillator and output a second control signal to a second switch between the second node and the ring oscillator, wherein when the first control signal corresponds to a first level and the second control signal corresponds to a second level, the first switch is turned on and the second switch is turned off so that the filter outputs the first voltage signal instead of the second voltage signal to the ring oscillator, and when the first control signal corresponds to the second level and the second control signal corresponds to the first level, the first switch is turned off and the second switch is turned on so that the filter outputs the second voltage signal instead of the first voltage signal to the ring oscillator.

7. A hybrid circuit capable of operating in one of an analog clock data recovery (ACDR) mode and a clock multiplication unit (CMU) mode, the hybrid circuit comprising:

a CMU circuit including a phase frequency detector, a charge pump, a filter, a ring oscillator, and a loop divider, wherein the filter is configured to determine at least one of a first voltage signal and a second voltage signal, that is outputted to the ring oscillator, according to an output of the charge pump, and the ring oscillator is configured to output at least one first clock according to the first voltage signal in the ACDR mode and output at least one second clock according to the second voltage signal in the CMU mode;
  a sampling circuit configured to operate according to an output of the ring oscillator;
  a phase detector configured to operate according to an output of the sampling circuit; and
  a multiplexer configured to electrically connect the phase detector and the charge pump and electrically disconnect the phase frequency detector from the charge pump in the ACDR mode, and electrically connect the phase frequency detector and the charge pump and electrically disconnect the phase detector from the charge pump in the CMU mode.

8. The hybrid circuit of claim 7, further comprising a control circuit configured to output a first control signal and a second control signal to the ring oscillator, wherein the ring oscillator operates in the ACDR mode when the first control signal corresponds to a first level and the second control signal corresponds to a second level, and the ring oscillator operates in the CMU mode when the first control signal corresponds to the second level and the second control signal corresponds to the first level.

9. The hybrid circuit of claim 8, wherein the ring oscillator includes a plurality of oscillating circuits coupled in series, and each of the oscillating circuits includes:
  a delay circuit configured to generate an oscillation output according to an oscillation input;
  an ACDR mode enabling circuit that is coupled between the delay circuit and a current source and includes a first transistor and a second transistor coupled in series, wherein a gate terminal of the first transistor is configured to receive the first voltage signal and a gate terminal of the second transistor is configured to receive the first control signal;
  a CMU mode enabling circuit that is coupled between the delay circuit and the current source and includes a third transistor and a fourth transistor coupled in series, wherein a gate terminal of the third transistor is configured to receive the second voltage signal and a gate terminal of the fourth transistor is configured to receive the second control signal; and
  a fifth transistor that is coupled between the delay circuit and the current source and that is configured to operate according to a control voltage.

10. The hybrid circuit of claim 9, wherein each of the oscillating circuits further includes: a sixth transistor that is coupled between the fifth transistor and the current source and includes a gate terminal for receiving a fixed voltage to keep the sixth transistor conductive.

11. The hybrid circuit of claim 7, further comprising: a control circuit configured to output a first control signal to a first switch between the first node and the ring oscillator and output a second control signal to a second switch between the second node and the ring oscillator, wherein when the first control signal corresponds to a first level and the second control signal corresponds to a second level, the first switch is turned on and the second switch is turned off so that the filter outputs the first voltage signal instead of the second voltage signal to the ring oscillator, and when the first control signal corresponds to the second level and the second control signal corresponds to the first level, the first switch is turned off and the second switch is turned on so that the filter outputs the second voltage signal instead of the first voltage signal to the ring oscillator.

\* \* \* \* \*